(12) United States Patent
Oosterlaken et al.

(10) Patent No.: US 12,237,195 B2
(45) Date of Patent: Feb. 25, 2025

(54) CASSETTE LID OPENING DEVICE

(71) Applicant: ASM IP Holding B.V, Almere (NL)

(72) Inventors: Theodorus G. M. Oosterlaken, Oudewater (NL); Maarten Hendrikus Maria Lamers, Vortum-Mullem (NL); Nimit Kothari, Almere (NL); Chaggai Shmuel Ganani, Almere (NL)

(73) Assignee: ASM IP Holding B.V., Almere (NL)

( * ) Notice: Subject to any disclaimer, the term of this patent is extended or adjusted under 35 U.S.C. 154(b) by 317 days.

(21) Appl. No.: 17/810,748

(22) Filed: Jul. 5, 2022

(65) Prior Publication Data
US 2023/0012302 A1 Jan. 12, 2023

Related U.S. Application Data

(60) Provisional application No. 63/218,844, filed on Jul. 6, 2021.

(51) Int. Cl.
*H01L 21/677* (2006.01)
(52) U.S. Cl.
CPC .............................. *H01L 21/67772* (2013.01)
(58) Field of Classification Search
CPC ......... H01L 21/67265; H01L 21/67772; H01L 21/67373; H01L 21/67775; H01L 21/67376
See application file for complete search history.

(56) References Cited

U.S. PATENT DOCUMENTS

| | | | |
|---|---|---|---|
| 2011/0005868 A1* | 1/2011 | Suzuki | H01L 21/67772 187/391 |
| 2012/0000816 A1 | 1/2012 | Bonora | |
| 2015/0243538 A1* | 8/2015 | Miyajima | H01L 21/67772 206/711 |
| 2020/0098604 A1* | 3/2020 | Sugimoto | H01L 21/67265 |
| 2020/0312691 A1* | 10/2020 | Kagami | H01L 21/68707 |

FOREIGN PATENT DOCUMENTS

| | | |
|---|---|---|
| EP | 1793420 A2 | 6/2007 |
| WO | 03/007347 A2 | 1/2003 |

OTHER PUBLICATIONS

Nov. 11, 2022—(EP) Extended Search Report—EP App 22183093.8.

* cited by examiner

*Primary Examiner* — Glenn F Myers
(74) *Attorney, Agent, or Firm* — Banner & Witcoff, Ltd.

(57) ABSTRACT

Cassette lid opening device for a semiconductor substrate processing apparatus comprising a housing, a door assembly, a transport mechanism, and at least one suspension. The housing has at least one wall with an associated wall opening. The door assembly comprises at least one door plate configured for substantially closing off the associated wall opening of the at least one wall. The transport mechanism includes a carriage which is connected to the door assembly and configured to transport the door assembly parallel to the at least one wall. The at least one suspension is arranged between the at least one door plate and the transport mechanism. The at least one suspension comprises a suspension spring assembly which allows movement of the at least one door plate in a direction perpendicular to the at least one wall.

21 Claims, 12 Drawing Sheets

CASSETTE LID OPENING DEVICE

FIELD OF THE DISCLOSURE

The present disclosure generally relates to a cassette lid opening device for a semiconductor substrate processing apparatus.

BACKGROUND

In clean room environments, typically wafer cassettes are used to transport wafers to and from semiconductor substrate processing apparatuses, such as vertical batch furnaces. A wafer cassette may be placed against a cassette lid opening device which may be arranged between a first environment, e.g., a cassette handling space, and a second environment, e.g., a wafer handling space of a semiconductor processing apparatus. The cassette lid opening device may comprise a wall having a wall opening for transferring wafers therethrough between the first and the second environments. The cassette lid opening device may have two functions.

A first function may be to gas sealingly separate the first environment from the second environment both when no cassette is placed against the cassette lid opening device as well as during the time that a cassette is placed against the cassette lid opening device. To that end, the cassette lid opening device may comprise a door assembly. The door assembly may be transportable by means of a transport mechanism between a first position in front of the wall opening and a second position laterally away from the wall opening so as to allow passage of wafers through the wall opening.

A second function of the cassette lid opening device may be to engage a cassette lid of a cassette which may be placed against the cassette lid opening device and to laterally move away the cassette lid while moving the door assembly to the second position, so as to open the cassette and the wall opening and allow passage of wafers through the wall opening. In known cassette lid opening devices the transport mechanism for transporting the door assembly and/or the cassette lid may be of high precision and robust so as to be able to be able to withstand high forces which may be exerted during gas sealingly closing off the wall opening.

SUMMARY

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

It may be an object to provide a cassette lid opening device in which the requirements for the transport mechanism of the door assembly and/or cassette lid in terms of high precision and robustness may be less strict.

To that end, there may be provided a cassette lid opening device according to claim 1. More particularly, there may be provided a cassette lid opening device for a semiconductor substrate processing apparatus. The cassette lid opening device may comprise a housing, a door assembly, a transport mechanism, and at least one suspension. The housing may have at least one wall with an associated wall opening. The door assembly may comprise at least one door plate configured for substantially closing off the associated wall opening of the at least one wall. The transport mechanism may include a carriage which is connected to the door assembly and may be configured to transport the door assembly parallel to the at least one wall between a first position in front of the associated wall opening and a second position laterally away from the associated wall opening so as to allow passage of wafers through the associated wall opening. The at least one suspension may be arranged between the at least one door plate and the transport mechanism. The at least one suspension may comprise a suspension spring assembly which allows movement of the at least one door plate in a direction perpendicular to the at least one wall.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

Various embodiments are claimed in the dependent claims, which will be further elucidated with reference to an example shown in the figures. The embodiments may be combined or may be applied separate from each other.

All of these embodiments are intended to be within the scope of the invention herein disclosed. These and other embodiments will become readily apparent to those skilled in the art from the following detailed description of certain embodiments having reference to the attached figures, the invention not being limited to any particular embodiment(s) disclosed.

BRIEF DESCRIPTION OF THE FIGURES

While the specification concludes with claims particularly pointing out and distinctly claiming what are regarded as embodiments of the invention, the advantages of embodiments of the disclosure may be more readily ascertained from the description of certain examples of the embodiments of the disclosure when read in conjunction with the accompanying drawings, in which:

DETAILED DESCRIPTION

In this application similar or corresponding features are denoted by similar or corresponding reference signs. The description of the various embodiments is not limited to the examples shown in the figures and the reference numbers used in the detailed description and the claims are not intended to limit the description of the embodiments, but are included to elucidate the embodiments.

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below. The illustrations presented herein are not meant to be actual views of any particular material, structure, or device, but are merely idealized representations that are used to describe embodiments of the disclosure.

As used herein, the term "wafer" may refer to any underlying material or materials that may be used, or upon which, a device, a circuit, or a film may be formed.

In the most general terms the present disclosure may provide a cassette lid opening device 10. The cassette lid opening device 10 may be configured for use in a semiconductor substrate processing apparatus. The cassette lid opening device 10 may comprise a housing 12, a door assembly 14, a transport mechanism 16, and at least one suspension 22, 44. The housing 12 may have at least one wall 30, 34 with an associated wall opening 32, 36. The door assembly 14 may comprise at least one door plate 40, 42 configured for substantially closing off the associated wall opening 32, 36 of the at least one wall 30, 34.

The transport mechanism 16 may include a carriage 18 which is connected to the door assembly 14 and may be configured to transport the door assembly 14 parallel to the at least one wall 30, 34 between a first position in front of the associated wall opening 32, 36 and laterally away from the associated wall opening 32, 36 so as to allow passage of wafers through the associated wall opening 32, 36.

The at least one suspension 22, 44 may be arranged between the at least one door plate 40, 42 and the transport mechanism 16. The at least one suspension 22, 44 may comprise a suspension spring assembly 20 which allows movement of the at least one door plate 40, 42 in a direction perpendicular to the at least one wall 30, 34.

Figure 1:
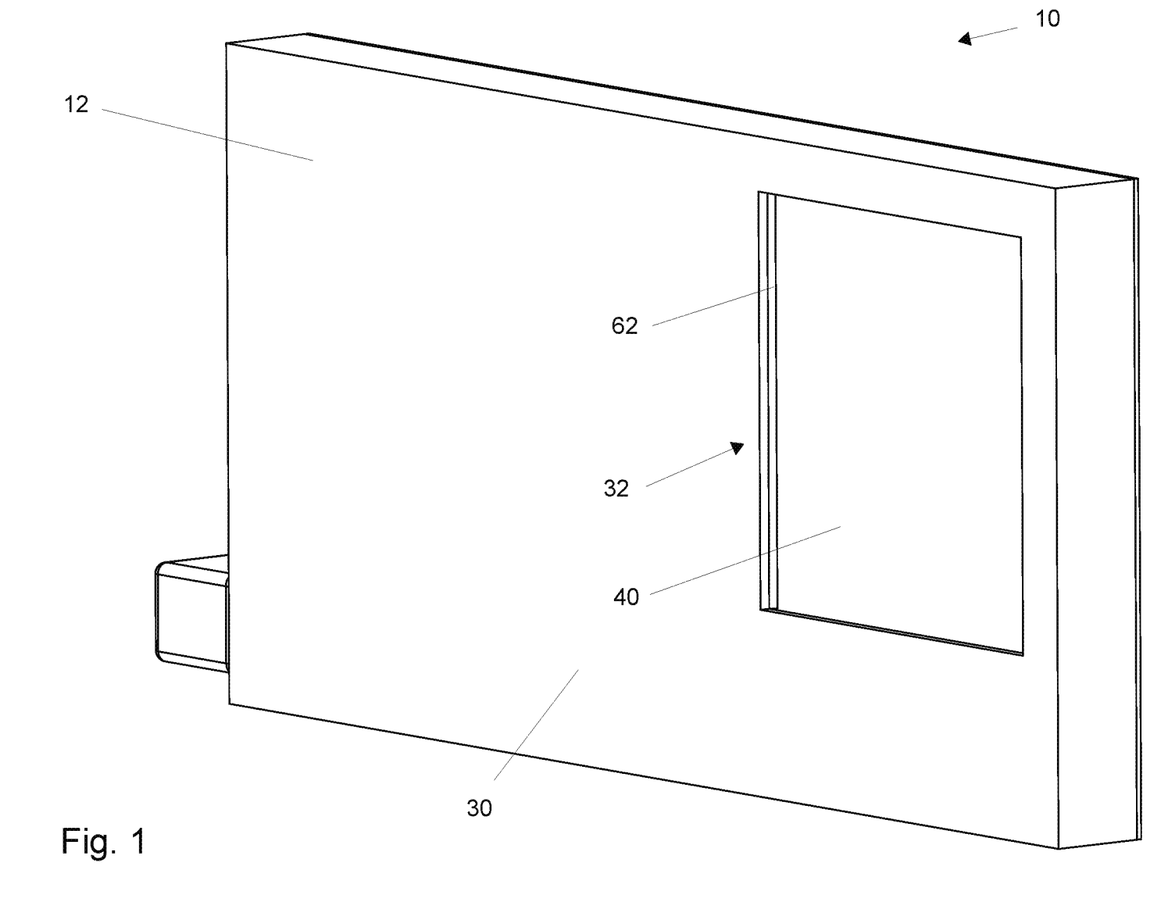
FIG. 1 shows a perspective view of an example of a cassette lid opening device according to the description with the door assembly being in the first, i.e., closed position.
Figure 2:
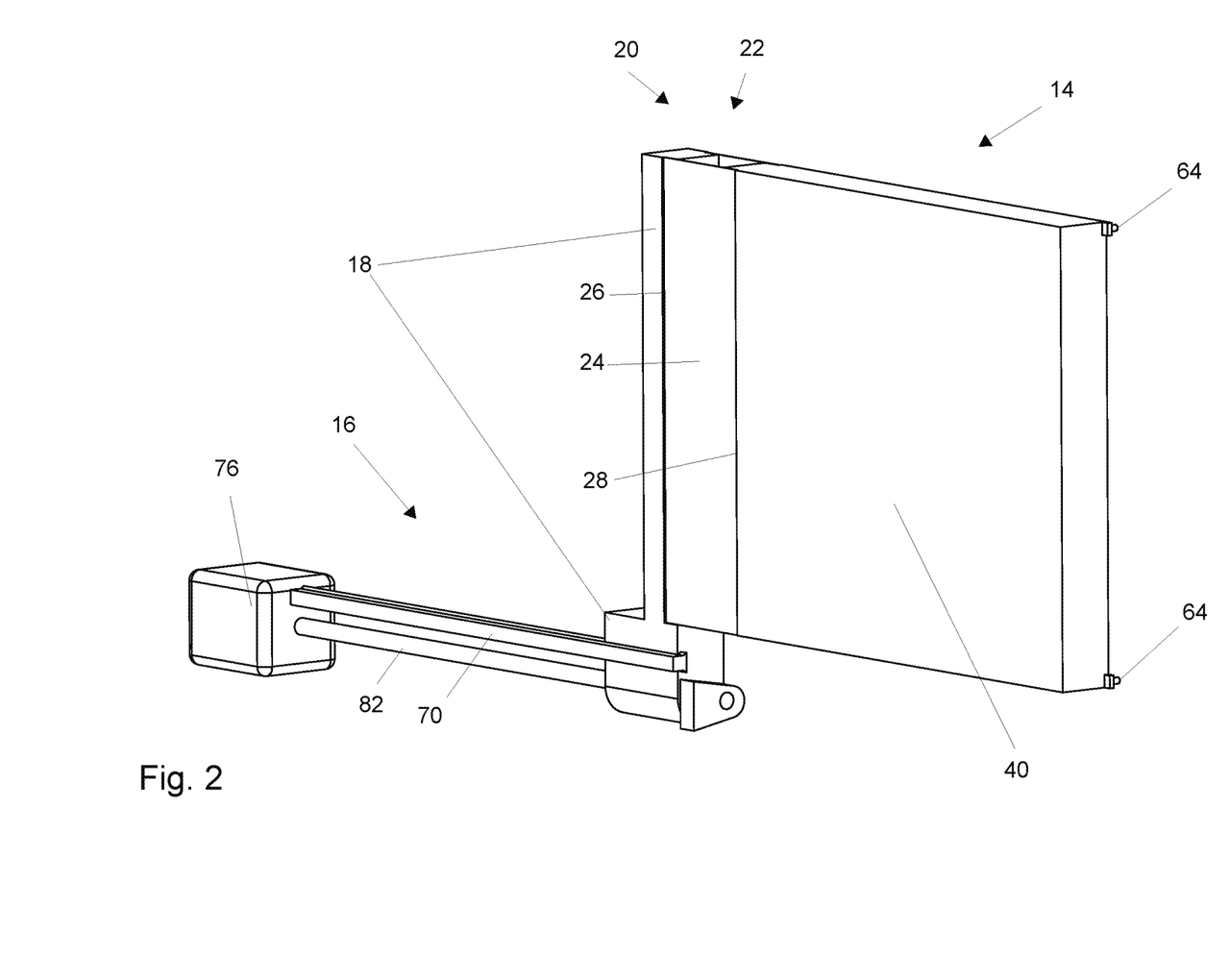
FIG. 2 shows the example of FIG. 1 with the housing removed.
Figure 3:
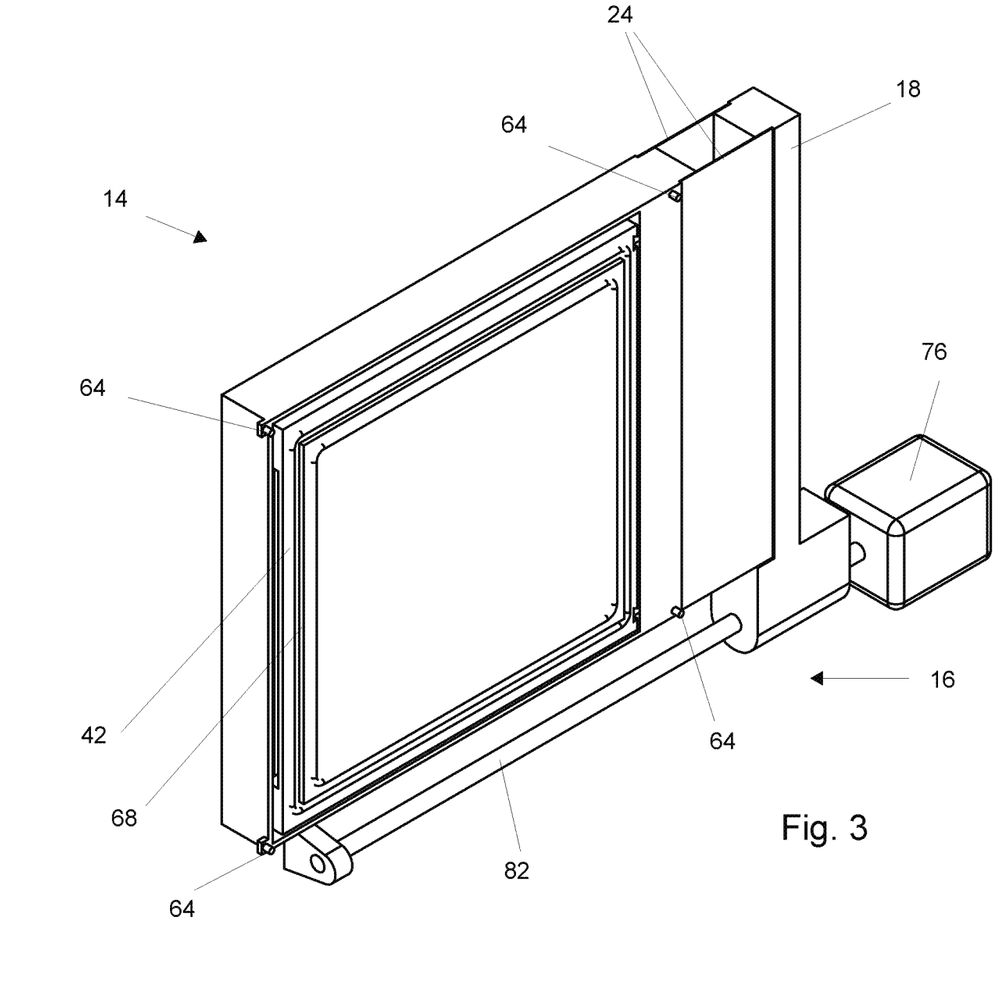
FIG. 3 show another perspective of the example of FIG. 2 and in which the door assembly is moved to the second, i.e., open position.
Figure 4:
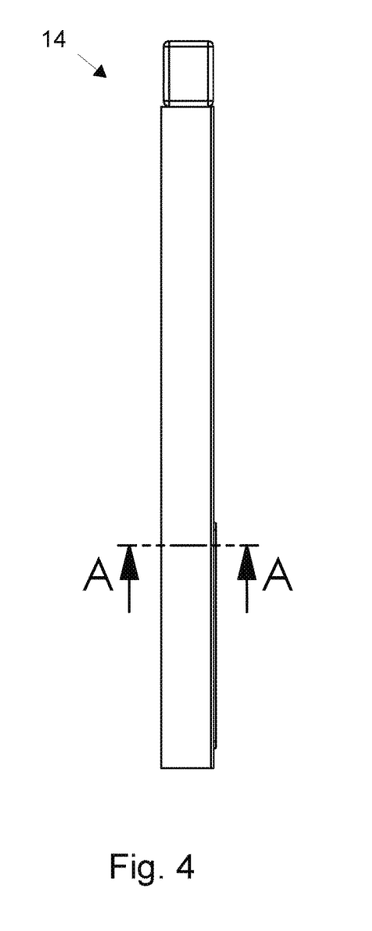
FIG. 4 shows a top view of the example of FIG. 1.

Generally, an inflatable seal 62 (see FIGS. 1, 5 and 6) may be provided between the door assembly, in particular a first door plate 40 thereof, and the first wall 32 of the housing. In order to ensure a gas tight seal, the inflatable seal 62 may be inflated. In the prior art cassette lid opener, the forces exerted by the inflatable seal on the door assembly were accommodated by the transport mechanism 16 of the door assembly 14, in particular the carriage 18 and the guide rail 70. In view of the high forces exerted by the inflatable seal, the carriage 18 and the guide rail 70 of the known cassette lid opening device had to be robust and also highly precise. The precision was required to maintain the door assembly 14 parallel to the at least one wall 30, 34 so as to ensure substantially evenly distributed closing pressure being exerted on the door assembly 14 along the entire circumference of the door assembly 14 by the inflatable seal 62.

With the cassette lid opening device 10 according to the description, the at least one suspension 22, 44 may ensure proper engagement between the at least one door plate 40, 42 and the at least one wall 30, 34, even when the transport mechanism 16 does not have the aforementioned high precision and robustness. Because of the suspension spring assembly 20, the at least one door plate 40, 42 may be movable with respect to the transport mechanism 16 in the direction perpendicular to the at least one wall 30, 34. This means that the transport mechanism 16 only may need to position the at least one door plate 40, 42 in a plane parallel to the at least one door plate 40. Any inaccuracy in the direction perpendicular to the at least one wall 30 34, may be accommodated by the allowed movement of the at least one door plate 40, 42 by the suspension spring assembly 20. Forces exerted on the door assembly 14 in a direction perpendicular to the at least one wall 30, 34 may be limited because these are not completely transferred to the transport mechanism 16 due to the presence of the suspension 22, 44 which comprises a spring assembly 20.

In an embodiment the at least one suspension 22, 44 may comprise a door assembly suspension 22. The suspension spring assembly 20 of the door assembly suspension 22 may comprise two parallel blade springs 24 which are each connected with a first longitudinal edge 26 to the carriage 18 and which are each connected with a second longitudinal edge 28 to the door assembly 14.

The two parallel blade springs 24 may enable a movement of the door assembly 14 with respect to the carriage 18 in a single direction, namely perpendicular to the at least one wall 30, 34. During this movement of the door assembly 14, the door assembly 14 will remain parallel to the at least one wall due to the parallel blade spring 24 assembly.

In an embodiment, of which an example is shown in the figures, the at least one wall 30, 34 of the housing 12 may comprise a first wall 30 and the at least one wall opening 32, 36 may comprise a first wall opening 32 in the first wall 30. The at least one door plate 40, 42 may comprise a first door plate 40 configured to substantially close off the first wall opening 32.

A circumferential inflatable seal 62 may be positioned between the door assembly 14 and the first wall 30 of the housing 12. The circumferential inflatable seal 62 may surround the first wall opening 32 and may have a deflated state in which the seal 62 does not engage with at least one of the first door plate 40 and the first wall 30. In an inflated state the circumferential inflatable seal 62 may sealingly engage with the first wall 30 and the first door plate 40 and pushes the door assembly 14 against the spring force of the suspension spring assembly 20 of the door assembly suspension 22 away from the first wall 30.

In a further elaboration of this embodiment, the door assembly may comprise at least one hard stop 64 for engaging a stop engagement point which is fixed relative to the housing 12 so as to limit the movement of the door assembly 14 induced by the inflatable seal 62 when being pushed away from the first wall 30.

In an embodiment, of which an example is shown in the figures, the at least one hard stop 64 may comprise three or more hard stops 64 which engage on different stop engagement points of the housing 12. When the door assembly 14 may be pushed with the hard stops 64 thereof against the stop engagement points of the housing 12, the position of the door assembly 14, relative to the housing may be well defined and the first door plate 40 of the door assembly 14 may be positioned exactly parallel to the first wall 30. Additionally, the forces exerted by the inflatable seal 62 on the door assembly 14 may be absorbed by the housing 12 via the hard stops 64 and the stop engagement points of the housing 12. Thus, these forces do not have to be absorbed by the transport mechanism 16. In fact, the parallel blade springs 24 of the door assembly suspension 22 may limit transfer of the forces that are exerted by the inflatable seal 62 on the door assembly 14 to the transport mechanism 16.

In an embodiment, the circumferential inflatable seal 62 may be connected to the first wall 30. Such a construction may be advantageous because the inflatable seal 62 may be stationary mounted instead of moveable, which would be the case when the inflatable seal were connected to the first door plate 40 of door assembly 14. Inflating a stationary seal 62 may be more convenient than inflating a moveably mounted inflatable seal 62.

In an embodiment the at least one wall 30, 34 of the housing 12 may comprises a first wall 30 and a second wall 34 which may be substantially parallel to each other. The at least one wall opening 32, 36 may comprise a first wall opening 32 in the first wall 30 and a second wall opening 36 in the second wall 34. The first wall opening 32 may be aligned with the second wall opening 36 so as to allow passage of a wafer through the first and the second wall openings 32, 36 along a central wall opening axis 38 which extends substantially perpendicular to the first wall 30 through a center of the first wall opening 32. The at least one door plate 40, 42 may comprise a first door plate 40 configured to substantially close off the first wall opening 32 and a second door plate 42 configured to substantially close off the second wall opening 36.

The at least one suspension 22, 44 may comprise a second door plate suspension 44 which supports the second door plate 42. The second door plate suspension 44 may comprises an actuator assembly 46 configured to effect movement of the second door plate 42 relative to the first door plate 40 in a direction substantially perpendicular to the second wall 34 towards and away from the second wall 34. The spring assembly 20 of the second door plate suspension 44 may constitute a part of the actuator assembly 46.

The cassette lid opening device 10 may be used to seal of a first environment of the semiconductor substrate processing apparatus, and a second environment of the semiconductor substrate processing apparatus. By virtue of the actuator assembly 46, the second door plate suspension 44 may be able to move the second door plate 42 in a direction substantially perpendicular to the second wall. 34. The second door plate 42 may thus be able to substantially close of the second wall opening 36, so that the aforementioned first and second environments of the semiconductor substrate processing apparatus are substantially closed off from each other.

Additionally, the second door plate 42 may be used to engage a lid of a wafer cassette and with the movement of the second door plate 42 remove the lid from the cassette and subsequently, with the movement of the door assembly transport the lid laterally away from the cassette. Because of the spring assembly 20 which may constitute a part the actuator assembly, the accuracy requirements of the other parts of the actuator assembly 46 may be less stern. Any inaccuracy of the other parts of the actuator assembly 46 causing a possible overshoot of the movement of the second door plate 42 may be compensated by compression of the spring assembly 20 of the second door plate suspension 44.

In an embodiment, the second door plate suspension 44 may comprise at least one second door plate guide 45 for guiding the movement of the second door plate 42 in the direction substantially perpendicular to the second wall 34 towards and away from the second wall 34. The actuator assembly 46 may be configured as a toggle lever assembly 48 which may be operatively connected with a toggle lever assembly motor 50 of which an example is visible in FIGS. 9 and 10.

Figure 9:
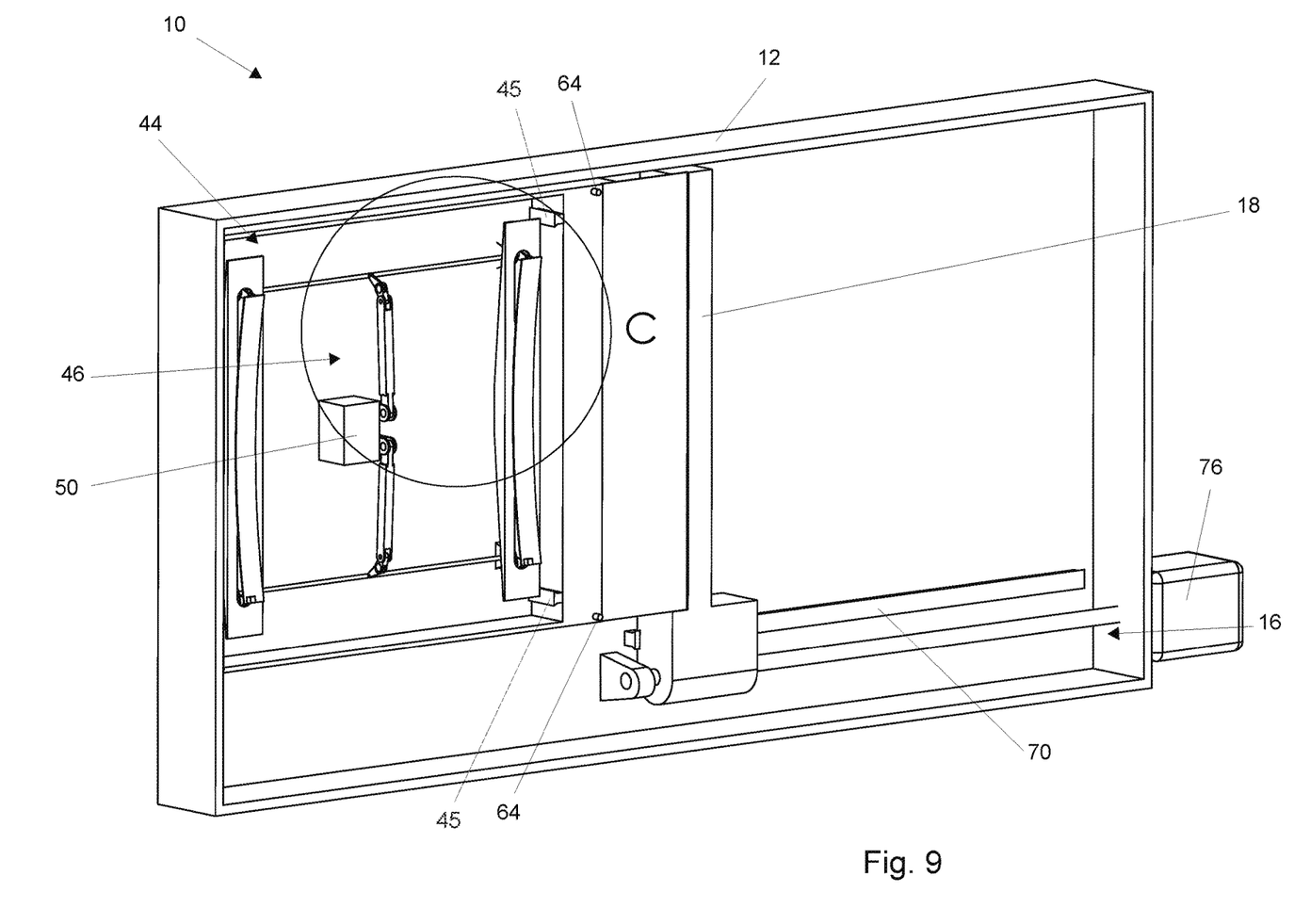
FIG. 9 shows the example of FIGS. 7 and 8 with the second door plate being removed.
Figure 10:
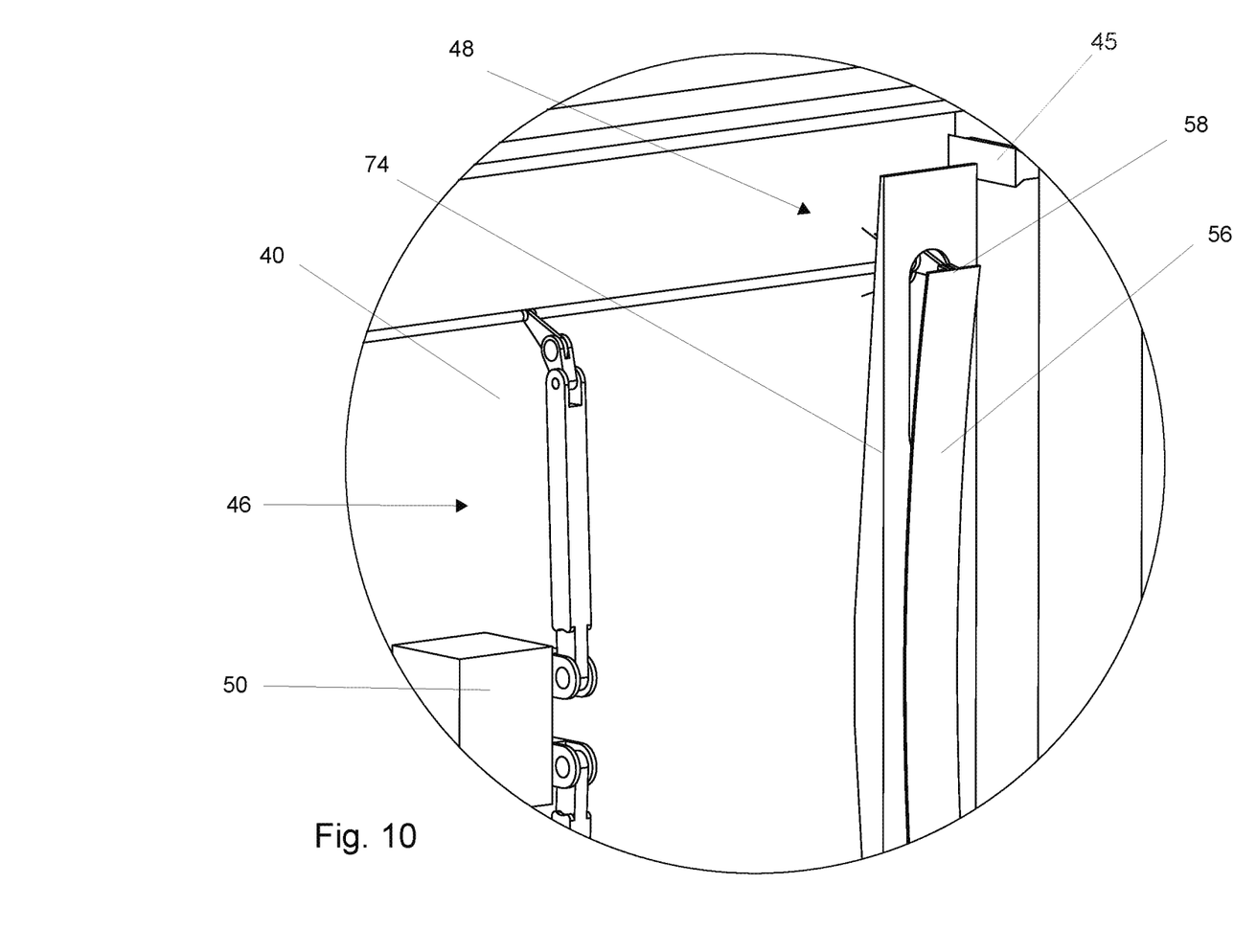
FIG. 10 shows detail C in FIG. 9.

By actuating the toggle lever assembly motor 50 the toggle lever assembly 48 may be operated such that the second door plate 42 may be moved relative to the first door plate 40.

In an embodiment, the toggle lever assembly 48 may include at least one first toggle lever 52 which may pivotally connected with the first door plate 40 and at least one second toggle lever 54 which may be hingedly connected to the spring assembly 20. In that embodiment, the second door plate 42 may be connected to the spring assembly 20.

In a further elaboration of that embodiment, the spring assembly 20 of the second door plate suspension 44 may include at least one blade spring 56 which at a first position 58 may be connected with the second toggle lever 54 of the toggle lever assembly 48. The second door plate 42 may be connected to a second position 60 of the at least one blade spring 56 so that, in a position of the toggle lever assembly 48 which corresponds to a closed position of the second door plate 42, the at least one blade spring 56 may bias the second door plate 42 against the second wall 34.

Figure 5:
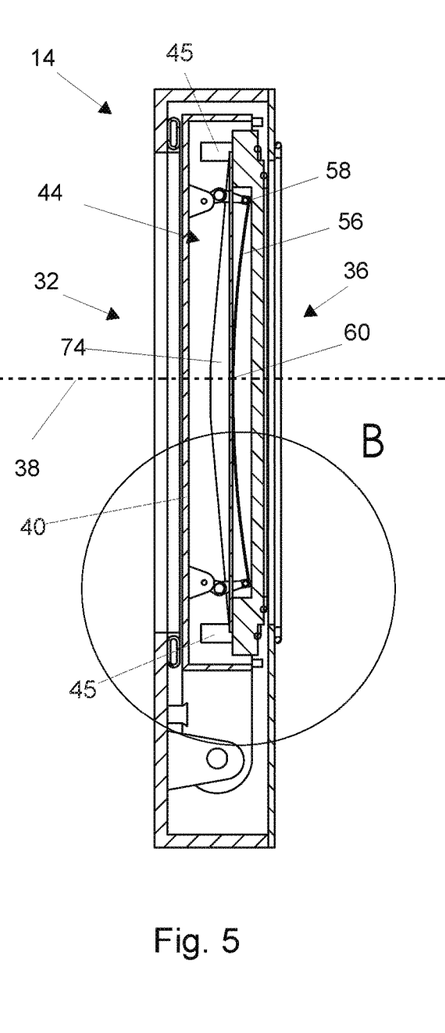
FIG. 5 shows a cross section along line A-A in FIG. 4.
Figure 6:
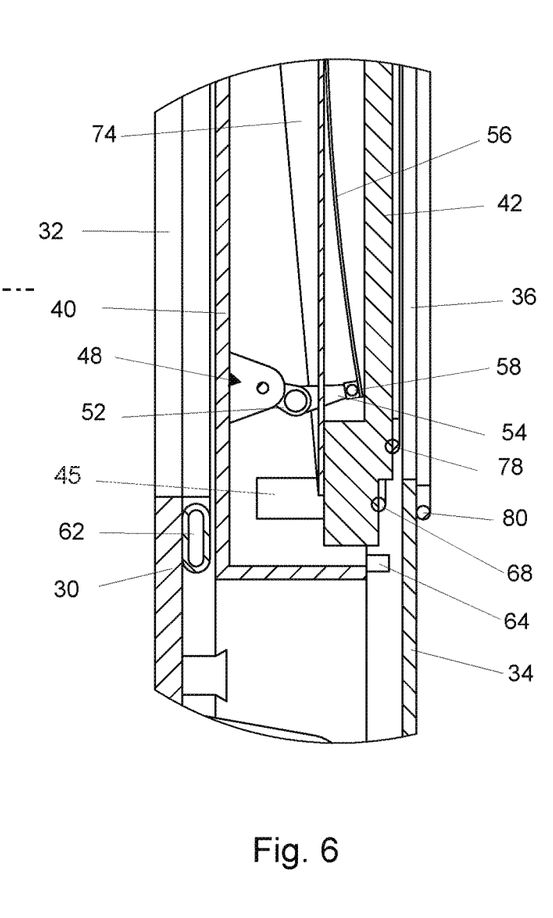
FIG. 6 shows detail B in FIG. 5.

As shown in the example of FIG. 5, the first position 58 at which the second toggle lever 54 may be connected with the blade spring 56 may be at a free end of the at least one blade spring 56. The second position 60 may be at a middle section of the at least one blade spring 56. In this example, the second door plate 42 may connected to a bracket 74 which may connected at the second position 60 with an associated one of the at least one blade spring 56. In the example, the spring assembly 20 of the second door plate suspension 44 may comprise two blade springs 56 and two brackets positioned near opposite ends of the second door plate 42.

In this way the toggle lever assembly 48 may move the spring assembly 20 from and towards the first door plate 40. With the spring assembly 20 the second door plate 42 may be moved also. When the second door plate 42 reaches the second wall 34, further movement by the toggle lever assembly 48 may result in compressing of the spring assembly 20. The movement of the second door plate 42 by the toggle lever assembly 48 towards the second wall 34 thus does not have to be very precise. Any impreciseness may be accommodated by the compression of the spring assembly 20.

Figure 13:
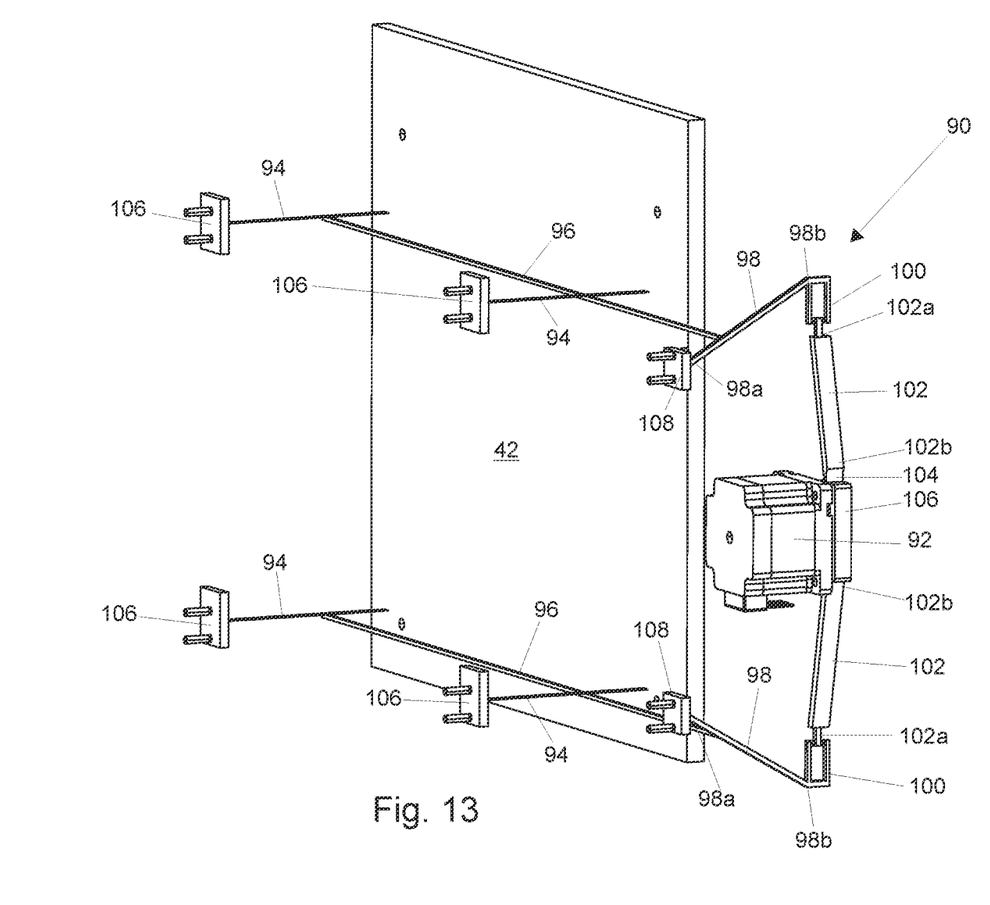
FIG. 13 shows a perspective view from a first point of view of an example of an integrally formed compliant mechanism which may be an embodiment of an actuator assembly configured to effect movement of a second door plate relative to a first door plate.
Figure 14:
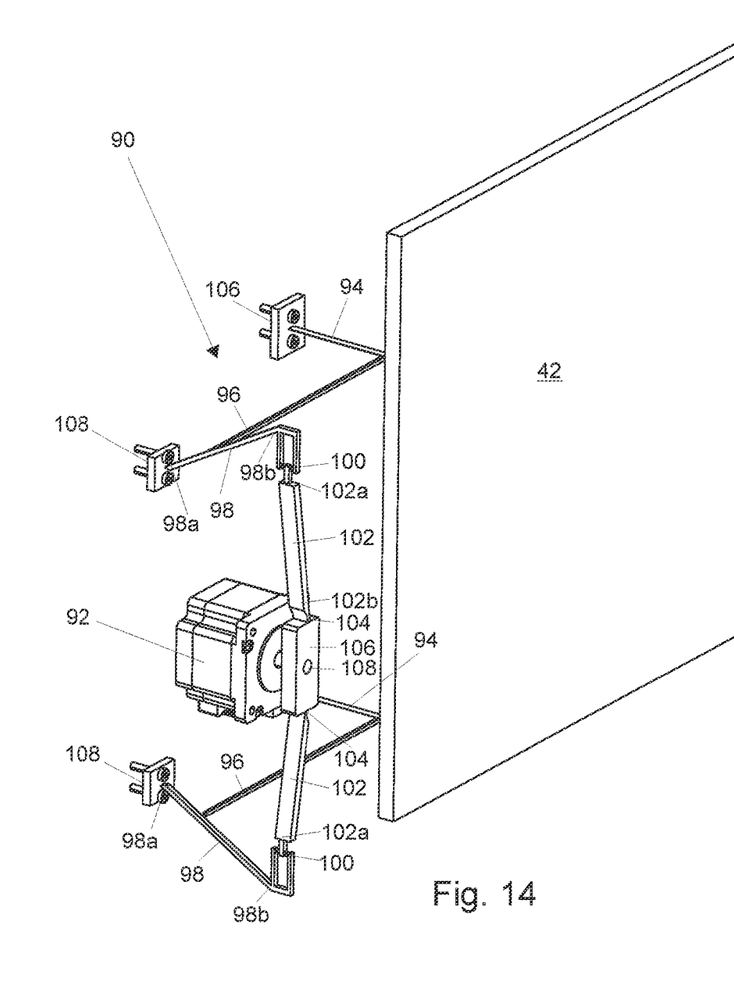
FIG. 14 shows the example of FIG. 13 from a second point of view.

FIGS. 13 and 14 show an example of an alternative embodiment of the second door plate suspension 44. For the sake of clarity, the first door plate 40 is not shown in FIGS. 13 and 14 but this first door plate 40 may have substantially the same configuration as the first door plate 40 shown in e.g. FIGS. 5, 6 and 11. The first door plate 40 is connected to connecting fixtures 106 which are shown in FIGS. 13 and 14. As in the embodiment shown in FIGS. 5, 6, 9, 10 and 11, again also in the embodiment shown in the example of FIGS. 13 and 14, the second door plate suspension may comprise at least one second door plate guide 45 for guiding the movement of the second door plate 42 in the direction substantially perpendicular to the second wall 34 towards and away from the second wall 34. The actuator assembly 46 may be configured as an integrally formed compliant mechanism 90 which may connect the first door plate 40 with the second door plate 42. The integrally formed compliant mechanism 90 may incorporating the spring assembly 20 of the second door plate suspension 44. The integrally formed compliant mechanism 90 may be operatively connected with a compliant mechanism drive motor 92.

Complaint mechanisms rely on their inherent elasticity to make the movements and do not require multiple moving parts. Thus, the number of metal on metal contacts may be minimized and may even be completely absent in the integrally formed compliant mechanism. An advantage of an integrally formed compliant mechanism may be that the release of particles may be minimized because no bearings or moving contact interfaces between separate parts are present in the integrally formed compliant mechanism. In fact, the integrally formed compliant mechanism may consist of a single piece which may be injection molded from a plastic material.

In an embodiment, the integrally formed compliant mechanism 90 may be a bi-stable compliant mechanism having two stable positions. In a first position the first door plate 40 may be at a first distance from the second door plate 42. In a second position the first door plate 40 may at a second distance from the second door plate 42, which second distance differs from the first distance.

A bi-stable integrally formed compliant mechanism may be relatively simple and may have the advantage that no force has to be exerted on the bi-stable mechanism when it has assumed one of the first and the second positions. Thus, the compliant mechanism drive motor 92 only has to be activated very briefly to bring the integrally formed compliant mechanism 90 for the first position to the second position and vice versa.

In an embodiment, the integrally formed compliant mechanism 90 may comprise flexible door plate connection links 94 which connect the first door plate 40 with the second door plate 42. The flexible door plate connection links 94 may integrally connected via an integrally formed linkage assembly 96, 98, 100, 102 to the compliant mechanism drive motor 92 as is clearly shown in the example of FIGS. 13 and 14.

The integrally formed linkage assembly 96, 98, 100, 102 may comprise at least one first link 96 which is connected to an associated one of the door plate connection links 94. Further, the linkage assembly may comprise at least one second link 98 of which a first end 98a may be hingedly connected to a fixed frame part 108 of the cassette lid opening device. A second end 98b of the second link 98 may be connected via a integrally formed hinge 100 to a first end 102a of a third link 102. A second end 102b of the third link 102 may be connected via a flexible hinge 104 to a rotor arm 106 of the integrally formed compliant mechanism 90. The rotor arm may be connected to a rotatable drive shaft 108 of the drive motor 92.

It should be noted that the example shown in FIGS. 13 and 14 is just one example of the many possibilities in which an integrally formed compliant mechanism 90 may be configured. The spring action of the integrally formed compliant mechanism is incorporated in the flexible structure of the compliant mechanism and is also a result of the chosen material of which the compliant mechanism 90 has been manufactured. The absence of sliding metal to metal contact points in the mechanism minimizes the release of particles which is an important advantage of the integrally formed compliant mechanism embodiment.

Figure 12:
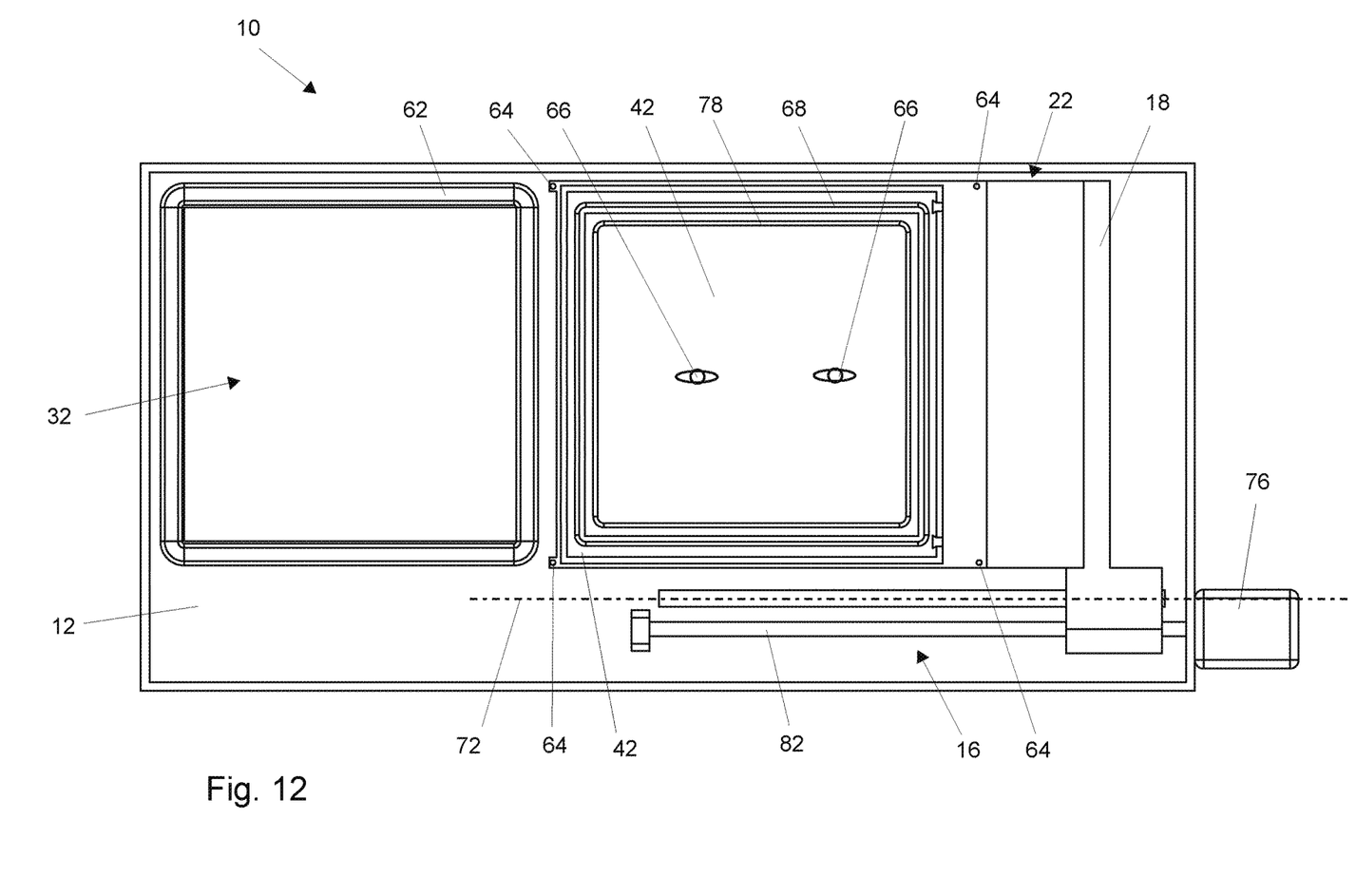
FIG. 12 shows a front view of the example of FIG. 8 with the door assembly laterally away from the wall opening in the second position.

In an embodiment as shown in FIG. 12, the second door plate 42 may comprise cassette lid engagers 66, configured to engage a lid of a cassette. In use, the lid of the cassette may be removed from the cassette by movement of the second door plate 42 towards the first door plate 40 and subsequently transporting the door assembly 14 from the first position to the second position laterally away from the second wall opening 36.

The cassette may comprise a plurality of stacked wafers. The cassette lid opening device 10 may thus be used to open the cassette by removing the lid of the cassette. When the door assembly 14 is moved laterally away from the second wall opening 32, the wafers in the cassette may be reached through the first and second wall openings 32, 36. The cassette lid engagers 66 may be embodied as a twistlocks, grippers, suction cups or another engager known in the field.

Figure 8:
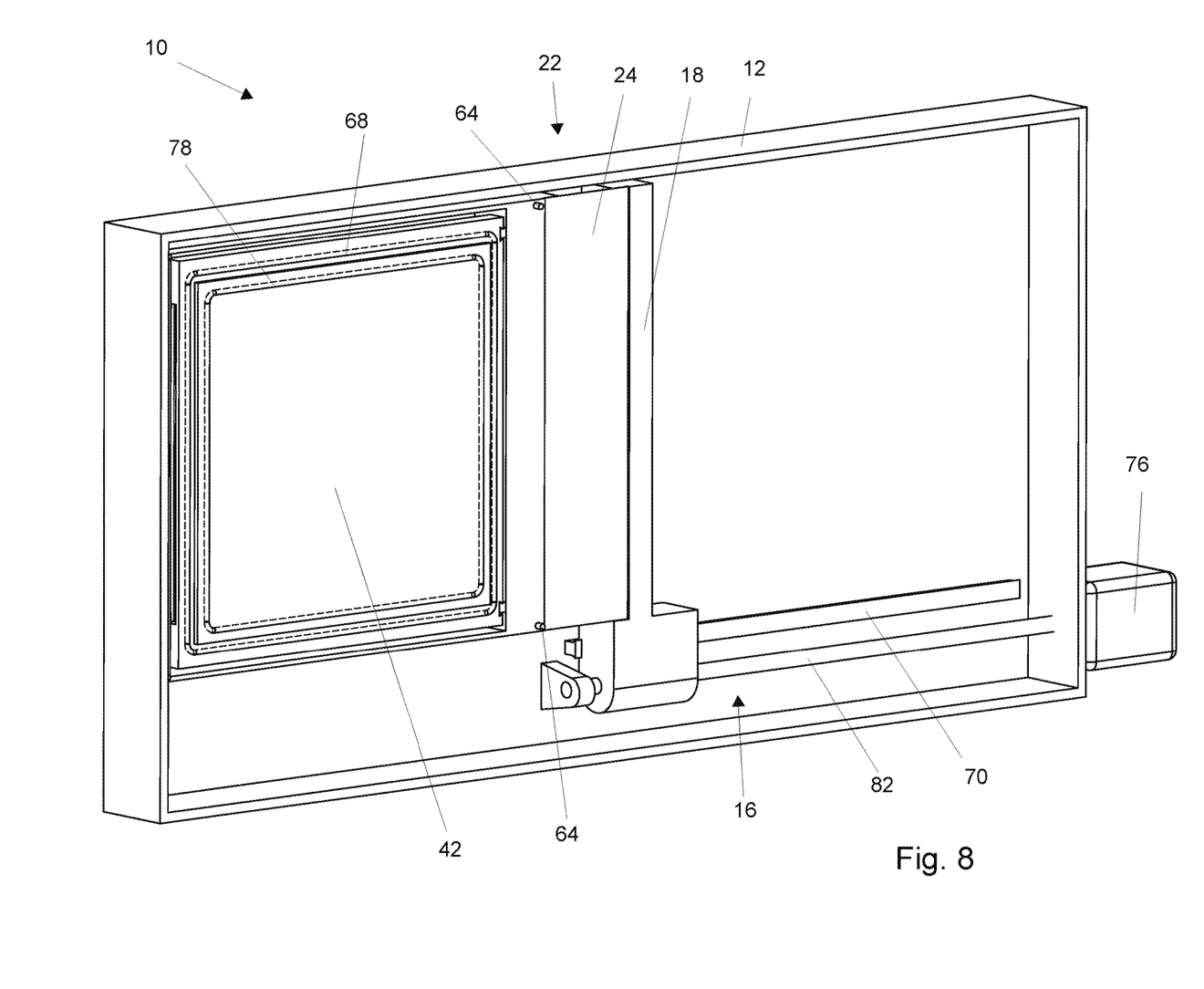
FIG. 8 shows the same perspective view as in FIG. 7 with a front wall of the housing being removed.
Figure 11:
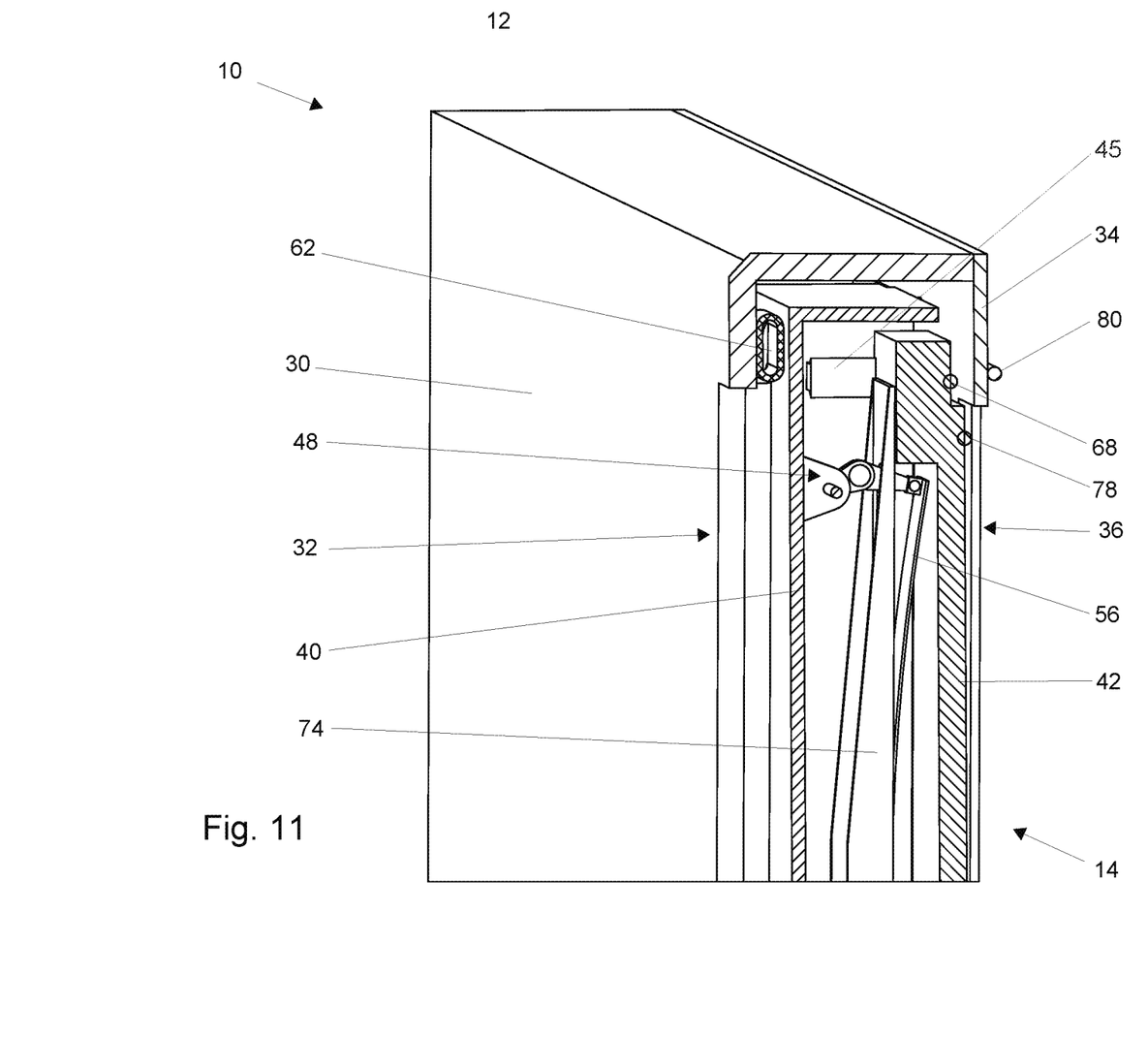
FIG. 11 shows a cross section of an example of the door assembly according to the description.

As shown in the example in FIGS. 8 and 11, the second door plate 42 may comprise a circumferential cassette lid seal 78 which, in use, is positioned between the second door plate 42 and the lid of the cassette for sealingly engagement with the second door plate 42 and the lid of the cassette. The cassette lid seal 78 may be used to create a low pressure chamber between the second door plate 42 and the lid of the cassette, which may be used to attach the lid of the cassette to the second door plate 42.

Figure 7:
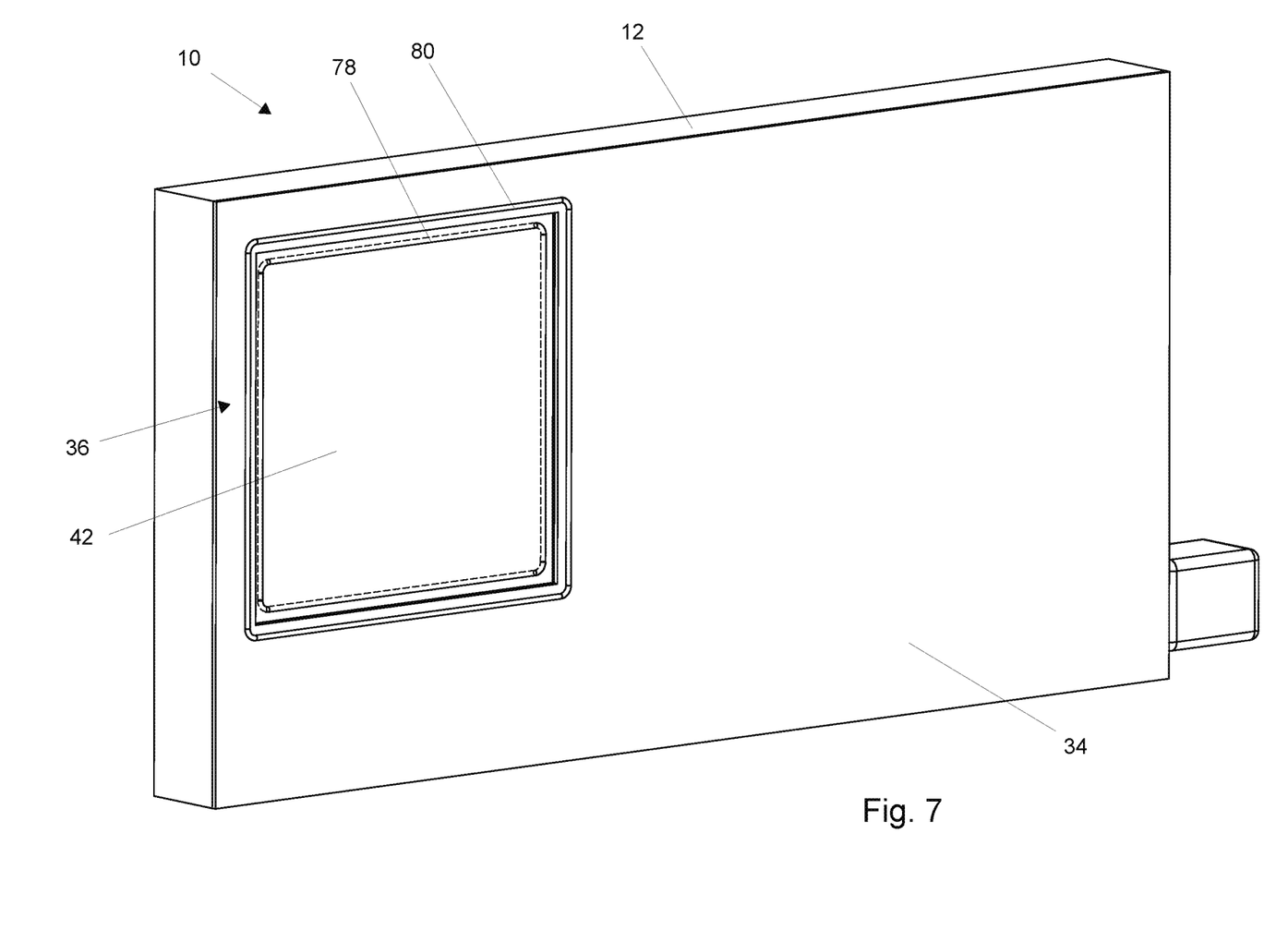
FIG. 7 shows another perspective view of the example of FIG. 1.

As visible in the example shown in FIGS. 7 and 11, the second wall 34 may comprise a cassette body seal 80 which, in use, is positioned between the second wall 34 and a body of the cassette for sealingly engagement with the second wall 34 and the body of the cassette.

In an embodiment a second circumferential seal 68 may be positioned between the second wall 34 and the second door plate 42 and may surround the second wall opening 36. The second circumferential seal 68 may substantially close off the second wall opening 36 when the actuator assembly 46 configured to effect movement of the second door plate 42 relative to the first door plate 40 has been actuated to move the second door plate 42 towards the second wall 34 so that the spring assembly 20 of the second door plate suspension 44 is spring loaded.

The actuator assembly 46 may thus press the second circumferential seal 68 with the second door plate 42 to the second wall 34. By virtue of the spring assembly 20 of the second door plate suspension 44, the actuator assembly 46 may be prevented from pushing too hard or too far, because trying to do so may result in compressing the spring assembly 20 and not in damage of the second wall 34 or actuator assembly 46 or other parts of the cassette lid opening device 10.

The second circumferential seal 68 may connected to the second door plate 42. Alternatively, the second circumferential seal 68 may also be connected to the second wall 34.

In an embodiment the transport mechanism 16 may comprise a guide rail 70 fixedly connected to the housing 12. The carriage 18 may moveably connected to the guide rail 70 and may be moveable along a guide rail axis 72 defined by the guide rail 70. A spindle 82 connected to a drive motor 76 may effect movement of the carriage along the guide rail 70. The guide rail axis 72 may be substantially parallel to the at least one wall 30, 34.

The guide rail 70 may thus be able to allow movement of the carriage 18, and thus the door assembly 14, substantially parallel with respect to the at least one wall 30, 34.

Although illustrative embodiments of the present invention have been described above, in part with reference to the accompanying drawings, it is to be understood that the invention is not limited to these embodiments. Variations to the disclosed embodiments can be understood and effected by those skilled in the art in practicing the claimed invention, from a study of the drawings, the disclosure, and the appended claims.

Reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this description are not necessarily all referring to the same embodiment.

Furthermore, it is noted that particular features, structures, or characteristics of one or more of the various embodiments which are described above may be used implemented independently from one another and may be combined in any suitable manner to form new, not explicitly described embodiments. The reference numbers used in the detailed description and the claims do not limit the description of the embodiments, nor do they limit the claims. The reference numbers are solely used to clarify.

LEGEND

10—cassette lid opening device
12—housing
14—door assembly
16—transport mechanism
18—carriage
20—suspension spring assembly
22—door assembly suspension
24—blade spring (of door assembly suspension)
26—first longitudinal edge (of blade spring)
28—second longitudinal edge (of blade spring)
30—first wall
32—first wall opening
34—second wall
36—second wall opening
38—central wall opening axis
40—first door plate
42—second door plate
44—second door plate suspension
45—second door plate guide
46—actuator assembly
48—toggle lever assembly
50—toggle lever assembly motor
52—first toggle lever
54—second toggle lever
56—blade spring (of second door plate suspension)
58—first position (of blade spring of second door plate suspension)
60—second position (of blade spring of second door plate suspension)
62—inflatable seal
64—hard stop
66—cassette lid engager
68—second circumferential seal
70—guide rail
72—guide rail axis
74—bracket
76—drive motor
78—cassette lid seal 78
80—cassette body seal
82—drive spindle
90—integrally formed compliant mechanism
92—compliant mechanism drive motor
94—flexible door plates-plate connection links
96—first link
98—second link
98a—first end of second link
98b—second end of second link
100—integrally formed hinge
102—third link
102a—first end of third link
102b—second end of third link
104—flexible hinge
106—rotor arm
108—drive shaft

The invention claimed is:

1. A cassette lid opening device for a semiconductor substrate processing apparatus, wherein the cassette lid opening device comprises:
a housing having at least one wall with an associated wall opening;
a door assembly comprising at least one door plate configured for substantially closing off the associated wall opening of the at least one wall;
a transport mechanism including a carriage which is connected to the door assembly and configured to transport the door assembly parallel to the at least one wall between a first position in front of the associated wall opening and a second position laterally away from the associated wall opening so as to allow passage of wafers through the associated wall opening; and
at least one suspension arranged between the at least one door plate and the transport mechanism, wherein the at least one suspension comprises a suspension spring assembly which allows movement of the at least one door plate in a direction perpendicular to the at least one wall,
wherein the at least one suspension comprises:
a door assembly suspension comprising the suspension spring assembly, wherein the suspension spring assembly of the door assembly suspension comprises two parallel blade springs which are each connected with a first longitudinal edge to the carriage and which are each connected with a second longitudinal edge to the door assembly.

2. The cassette lid opening device according to claim 1, wherein:
the at least one wall of the housing comprises a first wall;
the at least one wall opening comprises a first wall opening in the first wall;
the at least one door plate comprises a first door plate configured to substantially close off the first wall opening; and
a circumferential inflatable seal is positioned between the door assembly and the first wall of the housing wherein the circumferential inflatable seal surrounds the first wall opening wherein the circumferential inflatable seal has a deflated state in which the circumferential inflatable seal does not engage with at least one of the first door plate and the first wall and an inflated state in which the circumferential inflatable seal sealingly engages with the first wall and the first door plate and pushes the door assembly against spring force of the suspension spring assembly of the door assembly suspension away from the first wall.

3. The cassette lid opening device according to claim 2, wherein the door assembly comprises at least one hard stop for engaging a stop engagement point which is fixed relative to the housing so as to limit the movement of the door assembly induced by the circumferential inflatable seal when being pushed away from the first wall.

4. The cassette lid opening device according to claim 2, wherein the circumferential inflatable seal is connected to the first wall.

5. The cassette lid opening device according to claim 1, wherein:
the at least one wall of the housing comprises a first wall and a second wall which are substantially parallel to each other;
the at least one wall opening comprises a first wall opening in the first wall and a second wall opening in the second wall wherein the first wall opening is aligned with the second wall opening so as to allow passage of a wafer through the first and the second wall openings along a central wall opening axis which extends substantially perpendicular to the first wall through a center of the first wall opening;
the at least one door plate comprises a first door plate configured to substantially close off the first wall opening and a second door plate configured to substantially close off the second wall opening; and
the at least one suspension comprises a second door plate suspension which supports the second door plate, wherein the second door plate suspension comprises an actuator assembly configured to effect movement of the second door plate relative to the first door plate in a direction substantially perpendicular to the second wall towards and away from the second wall, and wherein the suspension spring assembly of the second door plate suspension constitutes a part of the actuator assembly.

6. The cassette lid opening device according to claim 5, wherein the second door plate suspension comprises at least one second door plate guide for guiding the movement of the second door plate in the direction substantially perpendicular to the second wall towards and away from the second wall, wherein the actuator assembly is configured as a toggle lever assembly which is operatively connected with a toggle lever assembly motor.

7. The cassette lid opening device according to claim 6, wherein the toggle lever assembly includes at least one first toggle lever which is pivotally connected with the first door plate and at least one second toggle lever which is hingedly connected to the suspension spring assembly, wherein the second door plate is connected to the suspension spring assembly.

8. The cassette lid opening device according to claim 7, wherein the suspension spring assembly of the second door plate suspension includes at least one blade spring which at a first position is connected with the second toggle lever of the toggle lever assembly, and wherein the second door plate is connected to a second position of the at least one blade spring so that, in a position of the toggle lever assembly which corresponds to a closed position of the second door plate the at least one blade spring biases the second door plate against the second wall.

9. The cassette lid opening device according to claim 5, wherein the second door plate suspension comprises at least one second door plate guide for guiding the movement of the second door plate in the direction substantially perpendicular to the second wall towards and away from the second wall, the actuator assembly is configured as an integrally formed compliant mechanism which connects the first door plate with the second door plate, and the integrally formed compliant mechanism incorporating the suspension spring assembly of the second door plate suspension, wherein the integrally formed compliant mechanism is operatively connected with a compliant mechanism drive motor.

10. The cassette lid opening device according to claim 9, wherein the integrally formed compliant mechanism is a bi-stable compliant mechanism having two stable positions, including a first position in which the first door plate is at a first distance from the second door plate and including a second position in which the first door plate is at a second distance from the second door plate, the second distance differing from the first distance.

11. The cassette lid opening device according to claim 9, wherein the integrally formed compliant mechanism comprises flexible door plate connection links which connect the first door plate with the second door plate, wherein the flexible door plate connection links are integrally connected via an integrally formed linkage assembly to the compliant mechanism drive motor.

12. The cassette lid opening device according to claim 11, wherein the integrally formed linkage assembly comprises at least one first link which is connected to an associated one of the flexible door plate connection links, wherein the linkage assembly comprises at least one second link of which a first end is hingedly connected to a fixed frame part of the cassette lid opening device and of which a second end is connected via a integrally formed hinge to a first end of a third link, and wherein a second end of the third link is connected via a flexible hinge to a rotor arm of the integrally formed compliant mechanism, the rotor arm being connected to a rotatable drive shaft of the drive motor.

13. The cassette lid opening device according to claim 5, wherein the second door plate comprises cassette lid engagers, configured to engage a lid of a cassette, whereby, in use, the lid of the cassette is removed from the cassette by movement of the second door plate towards the first door plate and subsequently transporting the door assembly from the first position to the second position laterally away from the second wall opening.

14. The cassette lid opening device according to claim 5, wherein a second circumferential seal is positioned between the second wall and the second door plate and surrounds the second wall opening, and wherein the second circumferential seal substantially closes off the second wall opening when the actuator assembly configured to effect movement of the second door plate relative to the first door plate has been actuated to move the second door plate towards the second wall so that the suspension spring assembly of the second door plate suspension is spring loaded.

15. The cassette lid opening device according to claim 14, wherein the second circumferential seal is connected to the second door plate.

16. The cassette lid opening device according to claim 1, wherein the transport mechanism comprises a guide rail fixedly connected to the housing, wherein the carriage is moveably connected to the guide rail and is moveable along a guide rail axis defined by the guide rail, and wherein the guide rail axis is substantially parallel to the at least one wall.

17. A cassette lid opening device for a semiconductor substrate processing apparatus, wherein the cassette lid opening device comprises:
a housing having at least one wall with an associated wall opening;
a door assembly comprising at least one door plate configured for substantially closing off the associated wall opening of the at least one wall;
a transport mechanism including a carriage which is connected to the door assembly and configured to transport the door assembly parallel to the at least one wall between a first position in front of the associated wall opening and a second position laterally away from the associated wall opening so as to allow passage of wafers through the associated wall opening; and at least one suspension arranged between the at least one door plate and the transport mechanism, wherein the at least one suspension comprises a suspension spring assembly which allows movement of the at least one door plate in a direction perpendicular to the at least one wall, wherein:
- the at least one wall of the housing comprises a first wall and a second wall which are substantially parallel to each other;
- the at least one wall opening comprises a first wall opening in the first wall and a second wall opening in the second wall wherein the first wall opening is aligned with the second wall opening so as to allow passage of a wafer through the first and the second wall openings along a central wall opening axis which extends substantially perpendicular to the first wall through a center of the first wall opening;
- the at least one door plate comprises a first door plate configured to substantially close off the first wall opening and a second door plate configured to substantially close off the second wall opening; and
- the at least one suspension comprises a second door plate suspension which supports the second door plate wherein the second door plate suspension comprises an actuator assembly configured to effect movement of the second door plate relative to the first door plate in a direction substantially perpendicular to the second wall towards and away from the second wall, and wherein the suspension spring assembly of the second door plate suspension constitutes a part of the actuator assembly.

18. The cassette lid opening device according to claim 17, wherein the second door plate suspension comprises at least one second door plate guide for guiding the movement of the second door plate in the direction substantially perpendicular to the second wall towards and away from the second wall, wherein the actuator assembly is configured as a toggle lever assembly which is operatively connected with a toggle lever assembly motor.

19. The cassette lid opening device according to claim 17, wherein the second door plate suspension comprises at least one second door plate guide for guiding the movement of the second door plate in the direction substantially perpendicular to the second wall towards and away from the second wall, the actuator assembly is configured as an integrally formed compliant mechanism which connects the first door plate with the second door plate, and the integrally formed compliant mechanism incorporating the suspension spring assembly of the second door plate suspension, wherein the integrally formed compliant mechanism is operatively connected with a compliant mechanism drive motor.

20. The cassette lid opening device according to claim 17, wherein the second door plate comprises cassette lid engagers, configured to engage a lid of a cassette, whereby, in use, the lid of the cassette is removed from the cassette by movement of the second door plate towards the first door plate and subsequently transporting the door assembly from the first position to the second position laterally away from the second wall opening.

21. The cassette lid opening device according to claim 17, wherein a second circumferential seal is positioned between the second wall and the second door plate and surrounds the second wall opening, and wherein the second circumferential seal substantially closes off the second wall opening when the actuator assembly configured to effect movement of the second door plate relative to the first door plate has been actuated to move the second door plate towards the second wall so that the suspension spring assembly of the second door plate suspension is spring loaded.

* * * * *